(12) United States Patent
Higo et al.

(10) Patent No.: US 9,627,053 B2
(45) Date of Patent: *Apr. 18, 2017

(54) MEMORY DEVICE AND ACCESS METHOD

(71) Applicant: Sony Corporation, Tokyo (JP)

(72) Inventors: Yutaka Higo, Kanagawa (JP);
Masanori Hosomi, Tokyo (JP);
Hiroyuki Ohmori, Kanagawa (JP);
Kazuhiro Bessho, Kanagawa (JP);
Kazutaka Yamane, Kanagawa (JP);
Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/074,460

(22) Filed: Mar. 18, 2016

(65) Prior Publication Data
US 2016/0203862 A1    Jul. 14, 2016

Related U.S. Application Data

(63) Continuation of application No. 14/497,978, filed on Sep. 26, 2014, now Pat. No. 9,324,424.

(30) Foreign Application Priority Data

Oct. 17, 2013  (JP) .................................. 2013-216429

(51) Int. Cl.
 *G11C 11/15* (2006.01)
 *G11C 13/00* (2006.01)
 *G11C 11/16* (2006.01)
(52) U.S. Cl.
 CPC ........ *G11C 13/003* (2013.01); *G11C 11/1659* (2013.01); *G11C 11/1675* (2013.01);
(Continued)

(58) Field of Classification Search
 CPC .................................................. G11C 13/0002
(Continued)

(56) References Cited

U.S. PATENT DOCUMENTS 5,695,864 A    12/1997  Sloncezewski
2007/0279963 A1*  12/2007  Tsuchida ................. G11C 11/16
                                                          365/148

(Continued)

FOREIGN PATENT DOCUMENTS

JP   2003-017782        1/2003
JP   2011-222829 A     11/2011

*Primary Examiner* — Hoai V Ho
*Assistant Examiner* — Jay Radke
(74) *Attorney, Agent, or Firm* — Michael Best & Friedrich LLP

(57) ABSTRACT

A memory device includes a plurality of bit lines extending in a first direction, a plurality of word lines extending in a second direction crossing the first direction, and a plurality of memory cells. Each memory cell includes a memory element and two select transistors disposed along the first direction and the memory element being configured to store information based on changes in resistance. A first and a second column are formed by repeatedly arranging a first group and a second group of the memory cells, respectively, along the first direction, and the second column is disposed adjacent to the first column and the first group is displaced in the first direction such that, in the second direction, a first select transistor in respective memory cells in the first column is aligned with a second select transistor in respective memory cells in the second column.

16 Claims, 12 Drawing Sheets

(52) U.S. Cl.
CPC ...... *G11C 13/0002* (2013.01); *G11C 13/0069* (2013.01); *G11C 2213/74* (2013.01); *G11C 2213/79* (2013.01)

(58) Field of Classification Search
USPC .................................................. 365/148, 158
See application file for complete search history.

(56) References Cited

U.S. PATENT DOCUMENTS

| | | |
|---|---|---|
| 2010/0238707 A1 | 9/2010 | Tsuchida |
| 2010/0238711 A1 | 9/2010 | Asao |
| 2011/0069534 A1 | 3/2011 | Inaba |
| 2012/0195094 A1* | 8/2012 | Greco .................... G11C 11/22 365/145 |
| 2015/0043272 A1 | 2/2015 | Zhou et al. |

* cited by examiner

FIG. 9

| TARGET MEMORY ELEMENT | WL2 | WL3 | WL4 | BL0 | BL1 | BL2 | BL3 | ... | BLm−2 | BLm−1 | STATE | |
|---|---|---|---|---|---|---|---|---|---|---|---|---|
| 034 | | H | H | H | L | L | L | ... | L | L | A1 | ⎫ |
| 123 | H | H | | H | H | L | L | ... | L | L | A2 | ⎪ WRITE "0" |
| 234 | | H | H | H | H | H | L | ... | L | L | A3 | ⎬ |
| 323 | H | H | | H | H | H | H | ... | L | L | A4 | ⎪ |
| ... | ... | ... | ... | ... | ... | ... | ... | ... | ... | ... | ... | ⎪ |
| (m−1)23 | H | H | | H | H | H | H | ... | H | L | Am−1 | ⎭ |
| 034 | | H | H | L | L | H | H | ... | H | H | B1 | ⎫ |
| 123 | H | H | | L | L | H | H | ... | H | H | B2 | ⎪ WRITE "1" |
| 234 | | H | H | L | L | L | H | ... | H | H | B3 | ⎬ |
| 323 | H | H | | L | L | L | L | ... | H | H | B4 | ⎪ |
| ... | ... | ... | ... | ... | ... | ... | ... | ... | ... | ... | ... | ⎪ |
| (m−1)23 | H | H | | L | L | L | L | ... | L | H | Bm−1 | ⎭ |

MEMORY DEVICE AND ACCESS METHOD

CROSS REFERENCE TO RELATED APPLICATIONS

The present application is a continuation application of application Ser. No. 14/497,978, filed Sep. 26, 2014 and claims the benefit of Japanese Priority Patent Application JP 2013-216429 filed Oct. 17, 2013, the entire contents of which are incorporated herein by reference.

BACKGROUND

The present technology relates to a technical field concerning to a memory device including a memory element configured to store information on the basis of changes in resistance and a method for accessing the memory device.

With the dramatic development of various types of information devices, including mobile terminals and high-capacity servers, elements of these information devices, such as memory devices or logic circuits, have to have higher performance, such as higher integration, higher speed, or lower power consumption.

Among others, non-volatile semiconductor memory has significantly developed, and flash memory as high-capacity file memory has become widespread with momentum to expel hard disk drives.

Further, non-volatile semiconductor memory is being developed to replace NOR flash memory, DRAM, and the like which are currently commonly used in code storage and working memory applications. Examples of such non-volatile semiconductor memory include magnetoresistive random access memory (MRAM), resistive random access memory (ReRAM), and phase-change random access memory (PCRAM). These types of memory each include a memory element configured to store data on the basis of changes in resistance and commonly called resistive memory.

Of these types of non-volatile memory, MRAM stores data on the basis of the magnetization direction of the magnetic body and thus allow the data to be rewritten fast and approximately an infinite number of times ($10^{15}$ or more). Owing to the fast operation and reliability thereof, MRAM is expected to be developed into code storage or working memory.

As described in U.S. Pat. No. 5,695,864 and Japanese Unexamined Patent Application Publication No. 2003-17782, methods for writing to MRAM include magnetic-field writing, where the magnetization is inverted using a current magnetic field generated by the lines, and spin-injection writing, where the magnetization is inverted using spin transfer torque.

Compared to magnetic-field writing, spin-injection writing obviates the necessity for the lines for generating a current magnetic field and therefore advantageously simplifies the cell structure. Hereafter, spin-injection-writing MRAM will be simply referred to as MRAM.

An MRAM cell includes a magnetic tunnel junction (MTJ).

An MTJ is a tunnel junction formed by disposing a tunnel barrier layer between a magnetic layer whose magnetization direction is fixed to a certain direction (hereafter referred to as the magnetization-fixed layer) and a magnetic layer whose magnetization direction is not fixed (hereafter referred to as the storage layer).

Information "0" or "1" is read from the memory cell by using the so-called tunnel magneto-resistance effect, in which the resistance of the MTJ varies with the relative angle between the magnetization directions of the magnetization-fixed layer and storage layer.

On the other hand, "0" or "1" is written to the memory cell by using the fact that when spin-polarized electrons which have passed through the magnetization-fixed layer enter the storage layer, they give a torque to this magnetic layer. When a current higher than or equal to a certain threshold passes through the storage layer, the magnetization direction of the storage layer is inverted.

SUMMARY

In writing to the memory cell through the MTJ, the selection between "0" and "1" is made by changing the polarity of the current passing through the MTJ.

For this reason, the MTJ is coupled to two lines (a bit line BL and a source line SL) through a cell transistor. To arrange bit lines BL and source lines SL in parallel with each other, each memory cell has to have a width of 4F ("F" represents a feature size). Each memory cell also has a height of 3F and therefore is $12F^2$ in size. This size is twice that of a DRAM memory cell, $6F^2$, and is a disadvantage in achieving high-capacity memory.

Japanese Unexamined Patent Application Publication No. 2011-222829 discloses a method of reducing the size of each memory cell to $6F^2$ by sharing a bit line BL and source line SL which are adjacent to each other; however, the gate width of each cell transistor is as small as 1F. For this reason, disadvantageously, when the current for inverting the magnetization of the storage layer is larger than the current which the cell transistor can transmit, information is difficult to write. To stably write information, it is preferable that the cell transistor have the largest possible gate width.

Accordingly, it is desirable to provide a resistive memory device which can increase the current applicable to the memory element and prevent increases in cell size.

A memory device according to an embodiment of the present technology includes multiple bit lines extending in a first direction, multiple word lines extending in a second direction crossing the first direction, and multiple memory cells each coupled to corresponding two of the word lines and corresponding two of the bit lines. Each of the memory cells includes a memory element and two select transistors, the memory element being configured to store information on the basis of changes in resistance. One terminal of the memory element is coupled to one of the two bit lines corresponding to the memory cell; the other terminal of the memory element is coupled to respective drains of the two select transistors; respective sources of the two select transistors are coupled to the other of the two bit lines corresponding to the memory cell; a gate of one of the two select transistors is coupled to one of the two word lines corresponding to the memory cell; and a gate of the other of the two select transistors is coupled to the other of the two word lines corresponding to the memory cell. One column is formed by repeatedly arranging the memory cell in the first direction, and a memory cell array is formed by repeatedly arranging the column in the second direction.

In this configuration, the current for access passes through one memory element via two select transistors.

In the memory device according to the embodiment of the present technology, adjacent select transistors of two memory cells adjacent in the first direction in the column preferably share a source.

Since the two adjacent memory cells share the source, for example, by sharing the diffusion region, memory cells can be efficiently laid out.

In the memory device according to the embodiment of the present technology, two columns adjacent in the second direction in the memory cell array preferably share one of the bit lines, and even-numbered columns and odd-numbered columns are preferably displaced from each other by a distance between adjacent word lines.

While two bit lines and two word lines correspond to one memory cell, two adjacent columns share one bit line.

By displacing the even-numbered columns and the odd-numbered columns from each other by the distance between adjacent word lines, an efficient layout is obtained.

In the memory device according to the embodiment of the present technology, of the memory cells, a target memory cell to be accessed is accessed by applying a predetermined select voltage to two word lines corresponding to the target memory cell to bring the select transistors of the target memory cell into conduction and applying first and second voltages to two bit lines corresponding to the target memory cell.

That is, the memory cell is selected by turning on the select transistors using the two word lines. Then the current for writing information "0" or "1" on the basis of the potential relationship between the two bit lines passes through the memory element.

An access method according to another embodiment of the present technology is a method for accessing the memory device described above and includes: bringing the two select transistors of a target memory cell to be accessed into conduction by applying a predetermined select voltage to two word lines corresponding to the target memory cell; and applying a first voltage to a first bit line of two bit lines corresponding to the target memory cell and applying a second voltage to a second bit line of the two bit lines.

That is, the memory cell is selected by turning on the select transistors using the two word lines. Then the current for writing information "0" or "1" on the basis of the potential relationship between the two bit lines passes through the memory element.

In the access method according to the other embodiment of the present technology, two columns adjacent in the second direction in the memory cell array of the memory device preferably share one of the bit lines, and even-numbered columns and odd-numbered columns are preferably displaced from each other by a distance between adjacent word lines. The method preferably further includes: applying the second voltage to all bit lines closer to the second bit line than to the first bit line; and applying the first voltage to all bit lines closer to the first bit line than to the second bit line.

Thus, access to the memory cell is prevented from being affected by the line capacitance.

In the access method according to the other embodiment of the present technology, after the target memory cell is accessed, a memory cell in an adjacent column is preferably accessed by changing the voltage applied to one of the first and second bit lines.

Thus, when memory cells are sequentially accessed, the frequency with which the voltages of the bit lines vary is reduced as much as possible.

In the access method according to the other embodiment of the present technology, after the target memory cell is accessed, another memory cell in the same column is preferably accessed by changing two word lines to which the select voltage is to be applied, without changing the voltages applied to the first and second bit lines.

Thus, when memory cells in the same columns are sequentially accessed, variations in the voltages of the bit lines are avoided.

According to the present technology, it is possible to provide a resistive memory device which can increase the current applicable to the memory cell and prevent increases in cell size.

Note that the effects described above are only illustrative and any effect described in the present disclosure can be obtained.

BRIEF DESCRIPTION OF THE DRAWINGS

FIG. 9 is a diagram showing states of the third write method according to the embodiment;

DETAILED DESCRIPTION OF EMBODIMENTS

Now, an embodiment will be described in the following order.
1. Configuration of Memory Device
2. Layout of Memory Cell Array
3. Access Operation
4. Summary and Modification

1. CONFIGURATION OF MEMORY DEVICE

Figure 1:
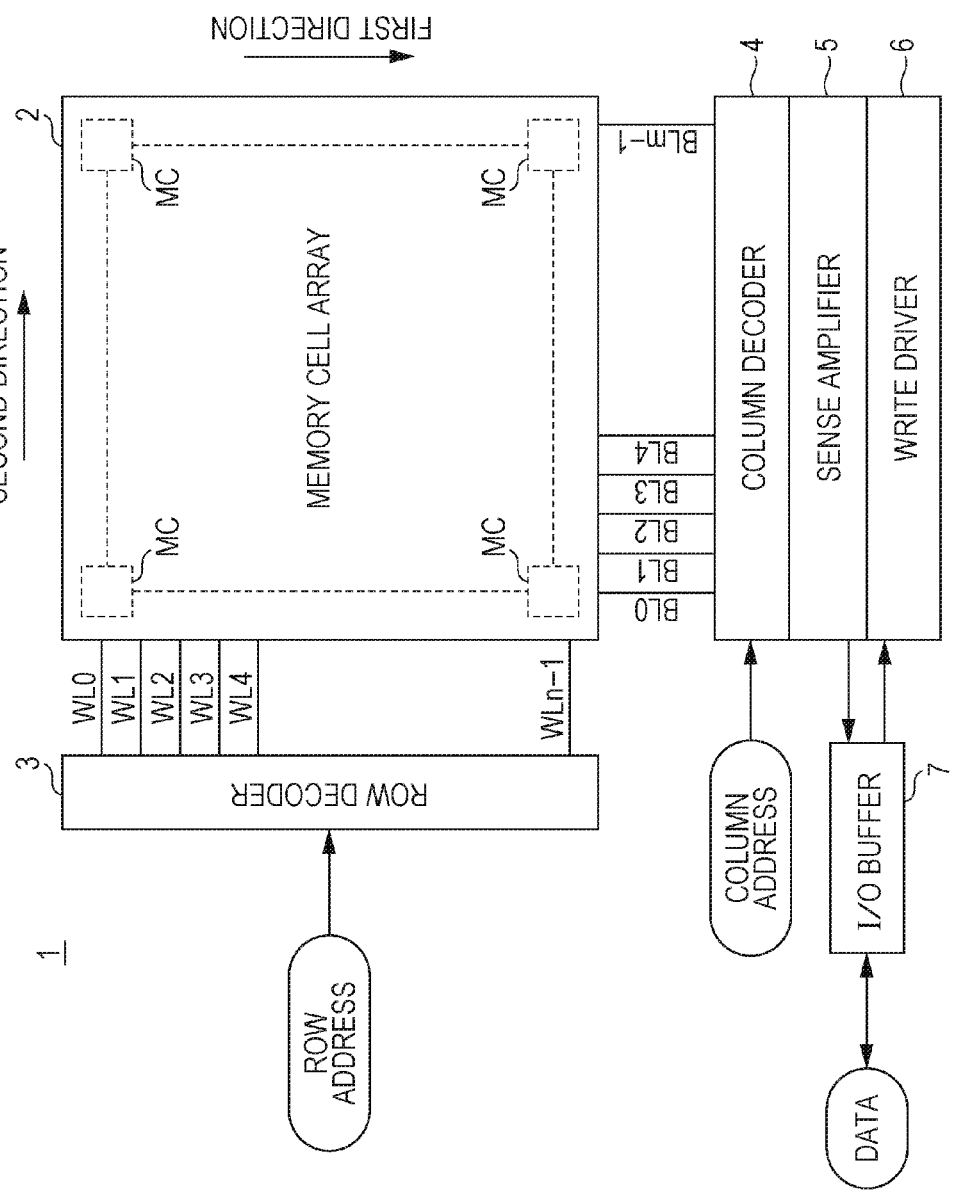
FIG. 1 is a block diagram showing the configuration of a memory device according to an embodiment of the present technology.

FIG. 1 is a block diagram showing an example internal configuration of a memory device 1 according to an embodiment.

The memory device 1 includes a memory cell array 2, a row decoder 3, a column decoder 4, a sense amplifier 5, a write driver 6, and an I/O buffer 7.

The memory device 1 receives addresses (row and column addresses) used to write or read information, from a control circuit (a central processing unit (CPU) or the like for writing or reading information to or from the memory device 1; not shown). The memory device 1 exchanges information to be written or read information with the control circuit.

The memory cell array 2 is formed by arranging, in a matrix, memory cells MC each including a memory element storing one-bit information "0" or "1" and select transistors.

Arranged in the memory cell array 2 are m number of bit lines BL0 to BLm−1 extending in a first direction (e.g., in a vertical direction) and n number of word lines WL0 to WLn−1 extending in a second direction (e.g., in a horizontal direction) crossing the first direction.

Hereafter, the bit lines BL0 to BLm−1 and word lines WL0 to WLn−1 will be collectively referred to as the "bit lines BL" and the "word lines WL", respectively.

Each memory cell MC is coupled to corresponding two bit lines BL and corresponding two bit lines BL. This will be described later in detail.

The left ends of the word lines WL are coupled to the row decoder 3, disposed on the left of the memory cell array 2 in FIG. 1. The lower ends of the bit line BL are coupled to the column decoder 4, disposed under the memory cell array 2 in FIG. 1.

The bits of an address for selecting a memory cell MC to or from which information is to be written or read are divided into two parts, and the higher-order bits are assigned to a row address, and the lower-order bits are assigned to a column address. The row address is inputted to the row decoder 3, and the column address is inputted to the column decoder 4.

The row decoder 3 applies necessary voltages (voltages for selecting the cell) to the word lines WL0 to WLn−1 on the basis of the row address.

The sense amplifier 5 is coupled to the bit lines BL through the column decoder 4 and detects stored information on the basis of a read current passing through a memory element from which information is to be read.

The write driver 6 writes information by applying write voltages to the bit lines BL through the column decoder 4 and thus passing a write current through a memory element to which information is to be written.

The column decoder 4 selects bit lines BL to be driven by the sense amplifier 5 or write driver 6 on the basis of the column address. That is, the column decoder 4 sets drive states in which the sense amplifier 5 or write driver 6 is to place the bit lines BL0 to BLm−1, so that information is read or written only from or to a memory cell MC in a column specified by the column address.

Figure 2:
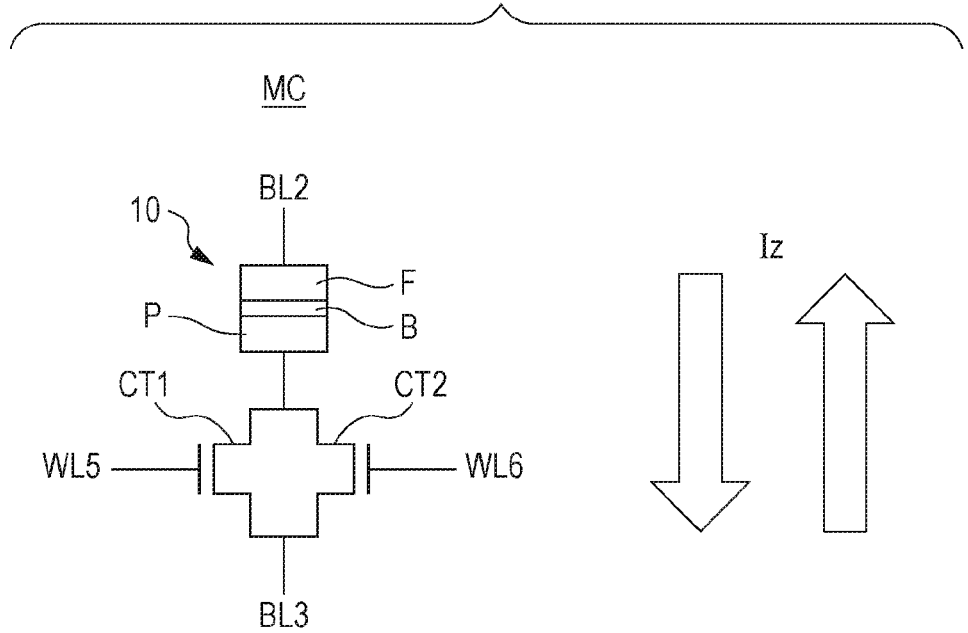
FIG. 2 is a diagram showing a memory cell according to the embodiment.
Figure 3:
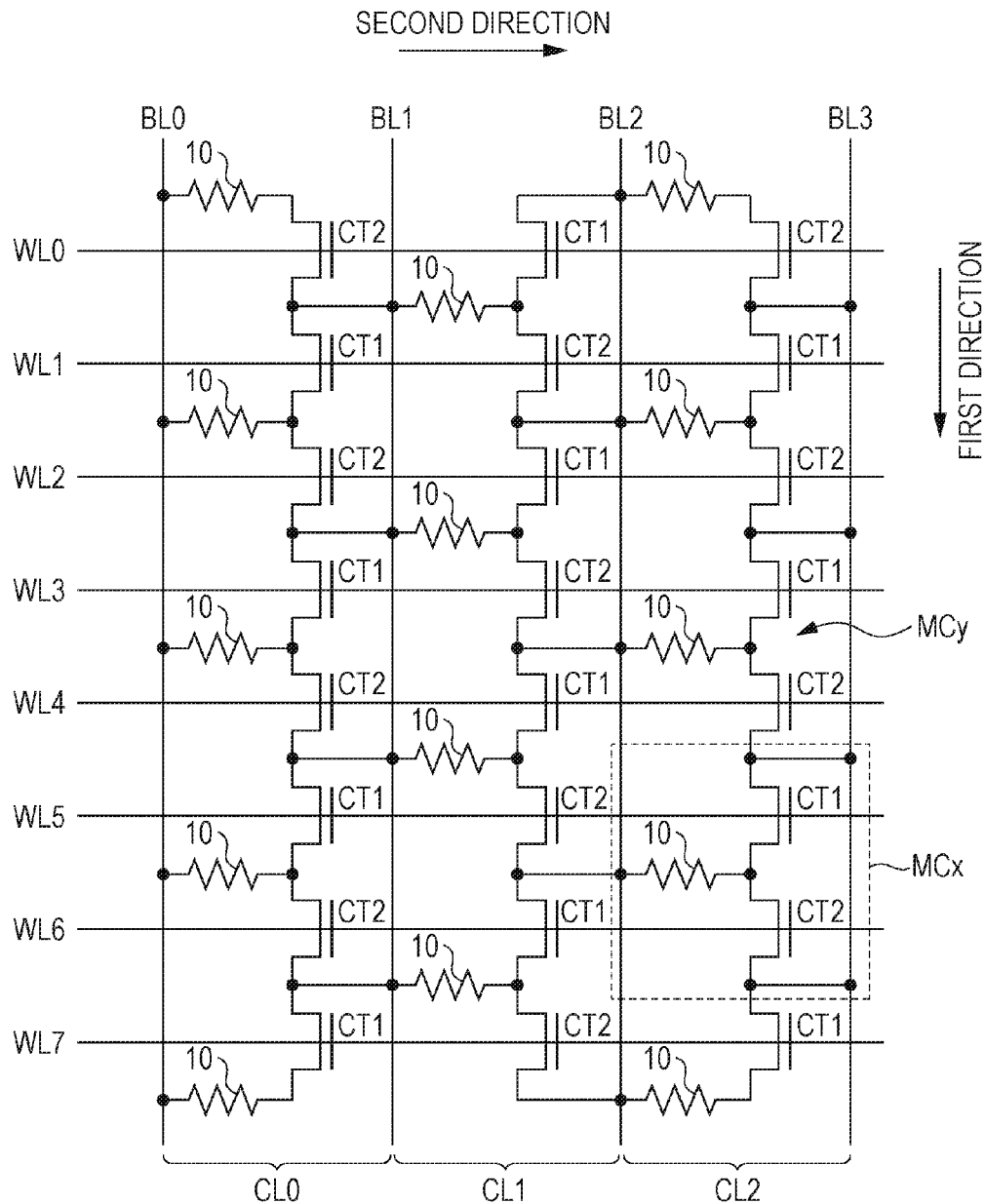
FIG. 3 is a circuit diagram of a memory cell array according to the embodiment.

FIG. 2 shows the configuration of a memory cell MC, and FIG. 3 shows the arrangement of the memory cells MC in the memory cell array 2.

The memory cell MC shown in FIG. 2 is a memory cell MCx surrounded by a broken line in FIG. 3, and bit lines BL and word lines WL are coupled thereto. Specifically, in FIG. 2, corresponding two bit lines, BL2 and BL3, and corresponding two word lines, WL5 and WL6, are coupled to the memory cell MC.

The memory cell MC shown in FIGS. 2 and 3 includes one memory element (MTJ) 10, and two select transistors, CT1 and CT2. Note that each memory element 10 is represented by a resistance symbol in FIG. 3.

As shown in FIG. 2, the memory element 10 serving as an MTJ is formed by stacking a magnetization-fixed layer P, a tunnel barrier layer B, and a storage layer F.

As described above, an MTJ is formed by disposing a tunnel barrier layer B between a magnetization-fixed layer P whose magnetization direction is fixed to a certain direction and a storage layer F whose magnetization direction is not fixed.

Information "0" or "1" is read from the memory element by using the so-called tunnel magneto-resistance effect, in which the resistance of the MTJ varies with the relative angle between the magnetization directions of the magnetization-fixed layer and storage layer.

On the other hand, "0" or "1" is written to the memory element by using the fact that when spin-polarized electrons which have passed through the magnetization-fixed layer P enter the storage layer F, they give a torque to this magnetic layer. When a current higher than or equal to a certain threshold passes through the storage layer F, the magnetization direction of the storage layer is inverted. In writing to the memory cell through the MTJ, the selection between "0" and "1" is made by changing the polarity of the current passing through the memory element 10 serving as an MTJ.

The current value for inverting the magnetization of the storage layer F is reduced in proportion to the volume of the memory element 10 and therefore can be scaled.

The select transistors CT1 and CT2 may be, for example, n-channel metal oxide semiconductor (MOS) field effect transistors (FET).

One terminal of the memory element 10 is coupled to one (e.g., BL2) of the two bit lines corresponding to the memory cell MC.

The other terminal of the memory element 10 is commonly coupled to the respective drains of the two select transistors, CT1 and CT2.

The respective sources of the select transistors CT1 and CT2 are commonly coupled to the other (e.g., BL3) of the two bit lines corresponding to the memory cell MC.

The gate of the select transistor CT1 is coupled to one (e.g., WL5) of the two word lines corresponding to the memory cell MC, and the gate of the select transistor CT2 is coupled to the other word line (e.g., WL6).

Memory cells MC thus configured are arranged in an array, as shown in FIG. 3.

One column CL is formed by repeatedly arranging a memory cell MC in the first direction. Specifically, columns CL0, CL1, CL2 and like are each a group of memory cells arranged in the first direction.

The memory cell array 2 is formed by repeatedly arranging the columns CL0, CL1, CL2, and the like in the second direction.

In each column CL, adjacent select transistors of every two adjacent memory cells MC share the source. For example, in FIG. 3, the select transistors CT1 of the memory cell MCx and the select transistor CT2 of a memory cell MCy adjacent thereto share the source diffusion region and are commonly coupled to the bit line BL3.

As seen in FIG. 3, two adjacent columns CL in the second direction in the memory cell array 2 share one bit line BL. For example, the columns CL0 and CL1 share the bit line BL1.

Further, the select transistors CT1 and CT2 in the even-numbered columns (CL0, CL2, and the like) and those in the odd-numbered columns (CL1, CL3, and the like) are displaced from each other by the distance between adjacent word lines.

For example, in the even-numbered columns (CL0, CL2, and the like), the gates of the select transistors CT1 are coupled to the odd-numbered word lines (WL1, WL3, and the like), and the gates of the select transistors CT2 are coupled to the even-numbered word lines (WL0, WL2, and the like). In the odd-numbered columns (CL0, CL2, and the like), on the other hand, the gates of the select transistors CT1 are coupled to the even-numbered word lines (WL0, WL2, and the like), and the gates of the select transistors CT2 are coupled to the odd-numbered word lines (WL1, WL3, and the like). This is because the select transistors CT1 and CT2 in the odd-numbered columns are displaced from those in the even-numbered columns by the distance between adjacent word lines WL.

In the memory cell array 2 of the present embodiment thus configured, the memory element 10 as an MTJ in each memory cell MC varies in resistance depending on whether the magnetization directions of the storage layer F and magnetization-fixed layer P sandwiching the tunnel barrier layer B are in parallel or antiparallel with each other. When these magnetization directions are in parallel with each other, the resistance is low; when the magnetization directions are in antiparallel with each other, the resistance is high. By using this fact, information can be written or read to or from each memory cell MC. For example, by assigning a low-resistance state to information "0" and assigning a high-resistance state to information "1", binary (one-bit) information can be written.

To rewrite information in the memory cell MC or read information written in the memory cell MC, a current Iz (see FIG. 2) has to be passed through the MTJ. The information in the memory cell MC can be rewritten by changing the magnetization direction of the storage layer F on the basis of the polarity of the current Iz, that is, whether the current Iz is passing through the MTJ downward or upward in FIG. 2.

2. LAYOUT OF MEMORY CELL ARRAY

Next, the layout of the memory cell array 2 will be described.

Figure 4:
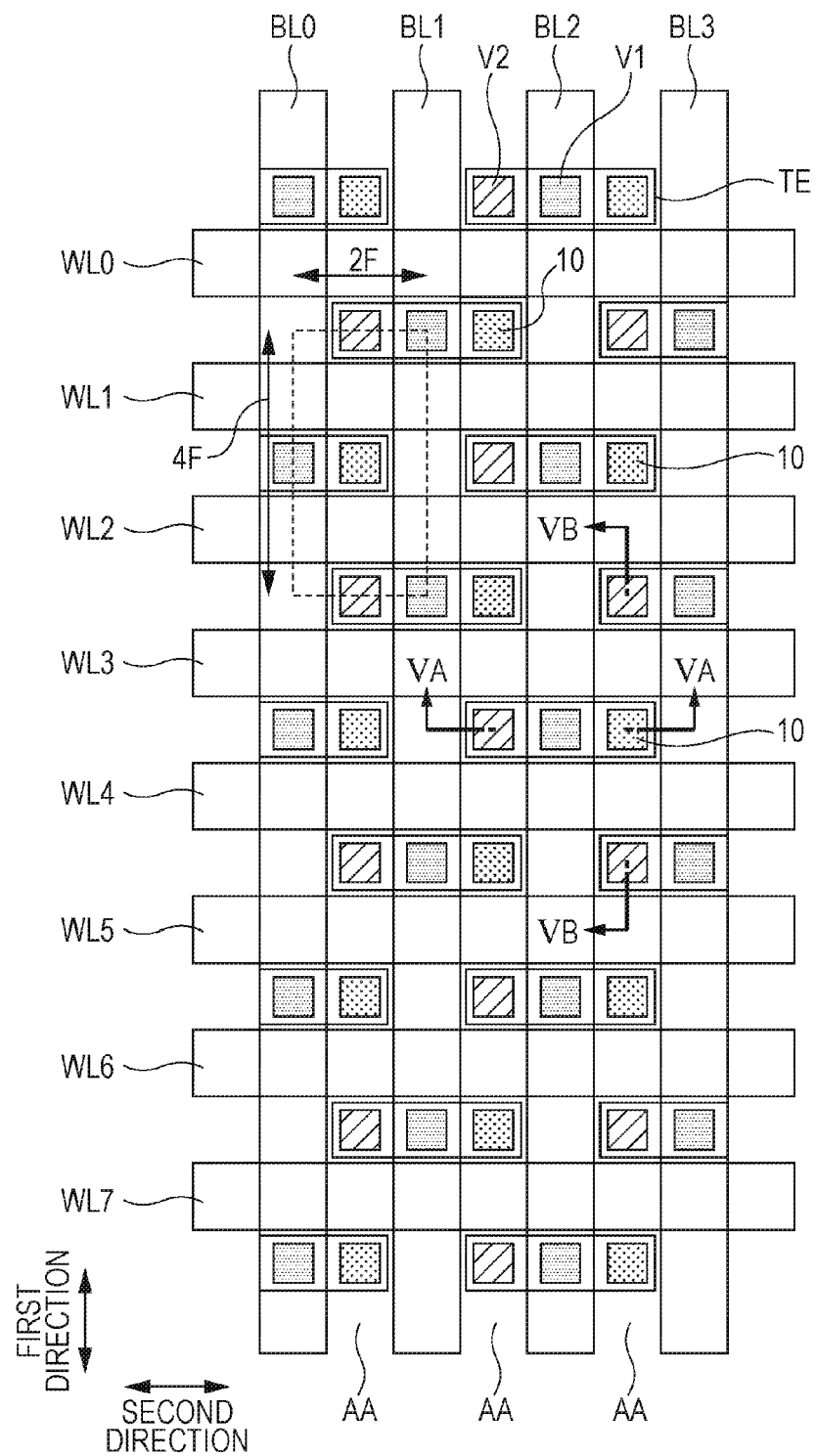
FIG. 4 is a diagram showing the layout of the memory cell array according to the embodiment.
Figure 5A:
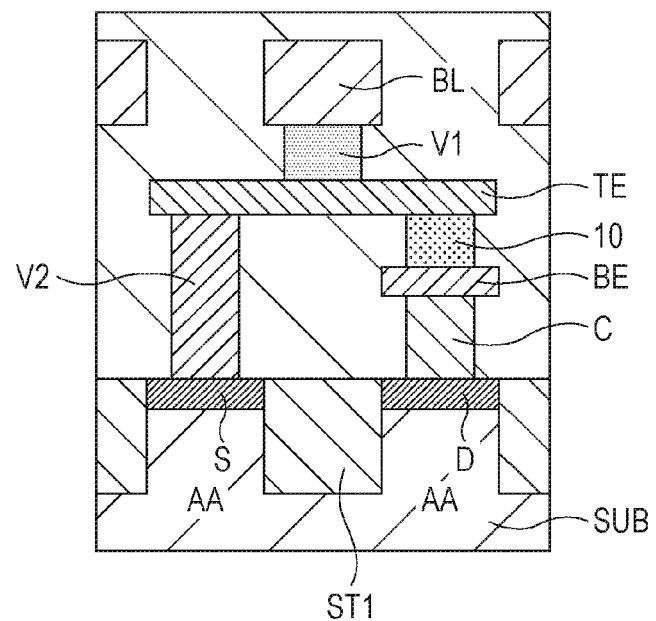
FIGS. 5A and 5B are sectional views of the memory cell array taken along lines VA-VA and VB-VB, respectively, of FIG. 4.
Figure 5B:
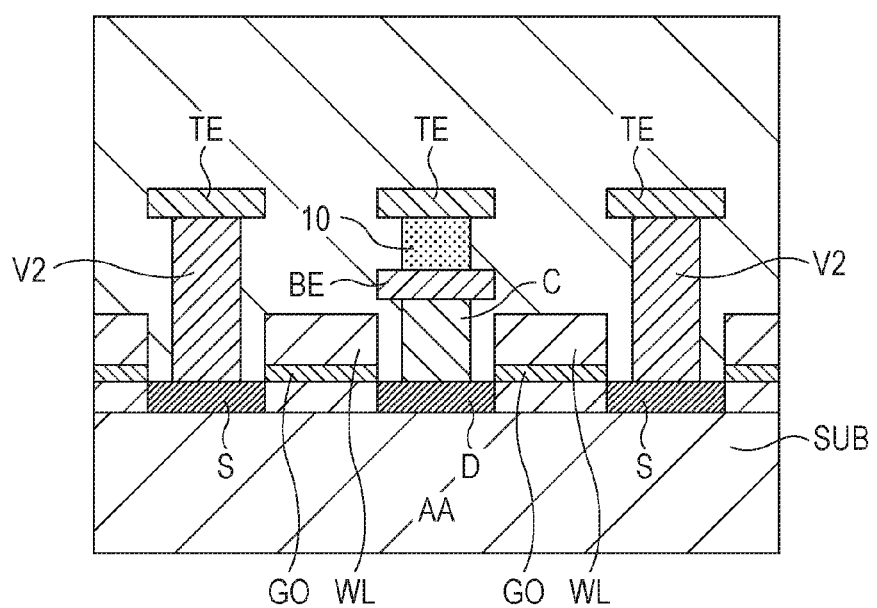

FIG. 4 shows the plan layout of the memory cell array 2. FIG. 5A shows a sectional view taken along a line VA-VA of FIG. 4, and FIG. 5B shows a sectional view taken along a line VB-VB of FIG. 4.

A p-type semiconductor substrate SUB includes element separation regions STI. Regions other than the separation regions STI in the surface region of the p-type semiconductor substrate SUB are element regions (active regions) AA (see FIGS. 5A and 5B).

The element separation regions STI and the element regions AA extend in the first direction and form a stripe pattern.

Typically, in a cell structure in which one select transistor is provided with respect to the memory element 10, the element regions AA form an insular pattern. In the present embodiment, on the other hand, the element separation regions STI and the element regions AA form a line-and-space stripe pattern. This advantageously makes it easy to perform lithography and improves variations in characteristics among the select transistors. The element separation regions STI are disposed under the bit lines, and the element regions AA are disposed between the bit lines.

In the stripe element regions AA, source regions S and drain regions D are alternately arranged in such a manner that adjacent source and drain regions sandwich a word line WL extending in the second direction. The source regions S and drain regions D are n$^+$-type diffusion regions formed by introducing a high-concentration n$^+$-type impurity.

Formed over the element regions AA and under the word lines WL is a gate oxide film GO. These components form the select transistors CT1 and CT2.

Disposed over the drain regions D are contacts C. The memory elements 10 serving as MTJs are disposed over the contacts C with lower electrodes BE therebetween. To avoid complication, the contacts C or lower electrodes BE are not shown in FIG. 4.

Disposed over the source regions S are via plugs V2. In FIG. 5A, an upper portion of each via plug V2 and an upper portion of a memory element 10 disposed on the right of the via plug V2 in the second direction with one bit line BL therebetween are coupled together by an upper electrode TE.

Disposed over the upper electrode TE is another via plug, V1. Disposed over the via plug V1 is a bit line BL extending in the first direction.

The layout in FIG. 4 will be described.

Regions between adjacent bit lines BL and regions between adjacent word lines WL form a lattice region. This lattice region includes the memory elements 10 and via plugs V2 which are alternately arranged in the first and second directions in a pattern like a checkerboard pattern.

Each memory element 10 and a via plug V2 disposed adjacent thereto in the second direction form a pair where the via plug V2 is located on the left and the memory element 10 is located on the right, and are coupled together by an upper electrode TE.

Disposed between the via plug V2 and the memory element 10 is a via plug V1.

As seen above, the via plug V2, via plug V1, and memory element 10 are disposed in this order, and this combination is repeatedly disposed in the first direction in a zigzag fashion.

The structure of the memory cell array 2 described above can provide memory cells MC each having a size of $8F^2$ where F represents the minimum feature size, as shown by a broken line in FIG. 4.

Further, since each memory cell MC includes the two select transistors (CT1 and CT2), the effective gate width is 2F and is twice that when each memory cell includes a single select transistor. Thus, it is possible to apply larger currents to each memory element 10 serving as an MTJ to write data stably.

3. ACCESS OPERATION

Hereafter, there will be described an access operation performed on a memory element 10 of the memory device 1 of the present embodiment.

While only a write operation is described herein, a read operation can also be performed in the same way by changing the magnitude of voltages applied to the bit lines BL.

First to fifth examples will be described as example write operations.

Note that in FIGS. 6A and 6B, 7, 8A to 8C, and 10A to 10C, numerals such as "012" and "101" are given to the memory elements 10. For example, "012" represents a memory element coupled to the bit line BL0 and means that two select transistors, CT1 and CT2 with respect to this memory element are controlled by the word lines WL1 and WL2. That is, "0" of "012" is derived from the bit line BL0, and "12" is derived from the word lines WL1 and WL2. The bit lines BL0 and BL1 and the word lines WL1 and WL2 correspond to a memory cell MC including the memory element "012".

FIRST EXAMPLE

Figure 6A:
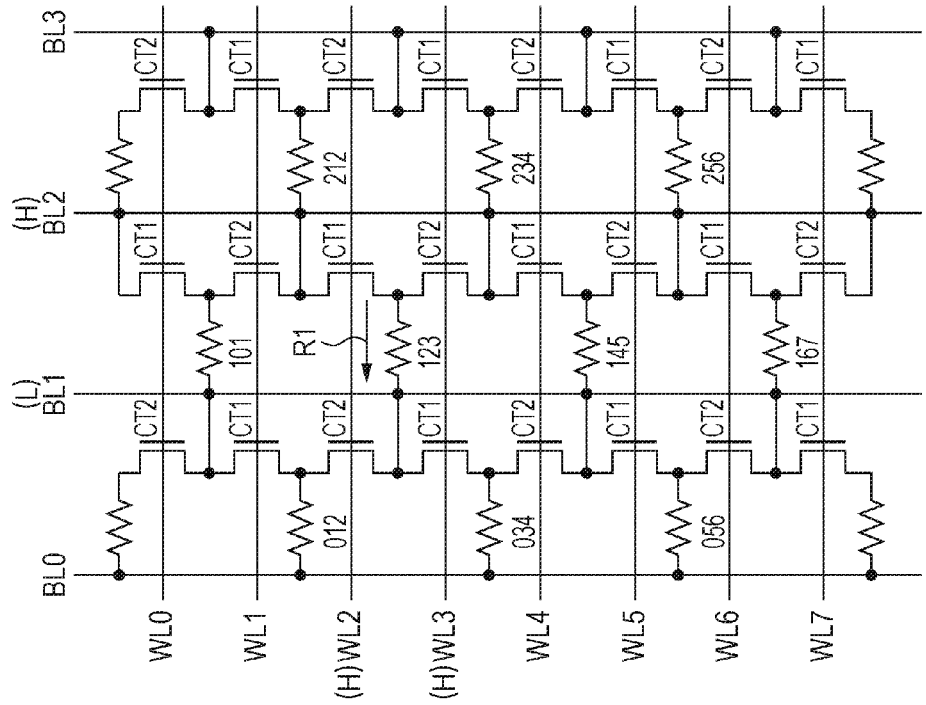
FIGS. 6A and 6B are diagrams showing a first write method according to the embodiment.

FIG. 6A shows a basic write method.

Assume that a low-resistance state, that is, "0" will be written to a memory element 123 in FIG. 6A. In this case, a voltage H is applied to the word lines WL2 and WL3; a voltage H to the bit line BL1; and a voltage L to the bit line BL2.

Each voltage H is higher than the corresponding voltage L. The voltage H and voltage L may be set to a power supply voltage VDD and a ground voltage GND, respectively, but not limited thereto. Note that the voltage H applied to the word lines WL to turn on the select transistors CT1 and CT2 is set to a voltage higher than a threshold voltage Vth of the select transistors.

The voltages H and L applied to the word lines WL and the voltages H and L applied to the bit lines BL may be the same or different. (The above conditions are applied to all voltages H and L described below.)

Thus, the current passes through the memory element 123 in the direction of an arrow R0 shown in FIG. 6A, reducing the resistance thereof, so that "0" is written thereto.

Figure 6B:
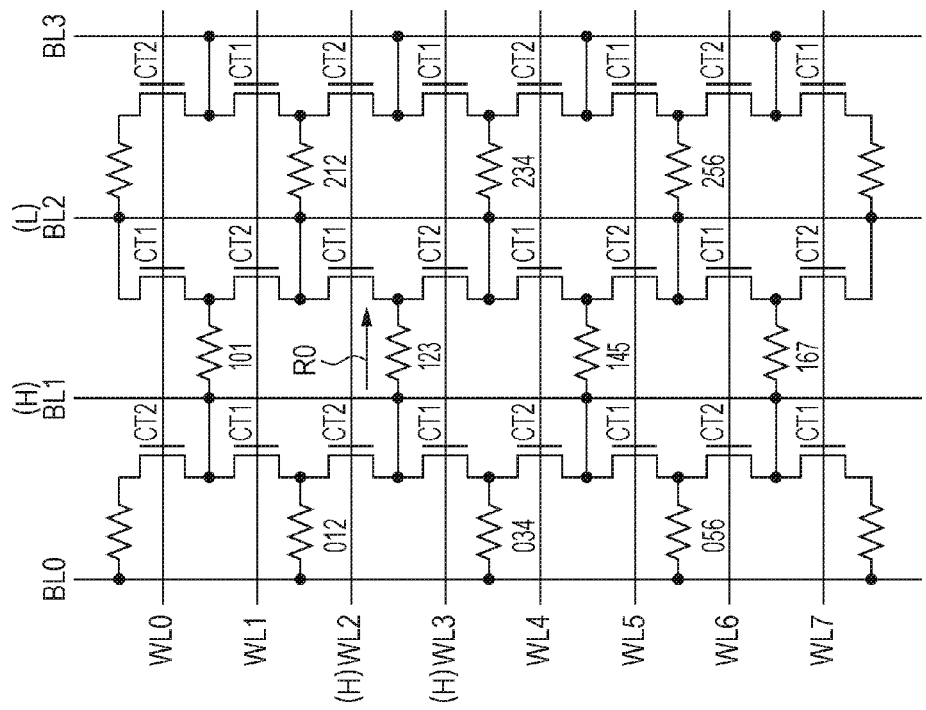

As shown in FIG. 6B, on the other hand, a high-resistance state, that is, "1" is written by applying the voltage L and voltage H to the bit line BL1 and bit line BL2, respectively.

In this case, the current passes through the memory element 123 in the direction of an arrow R1, increasing the resistance thereof, so that "1" is written thereto.

While writing of "0" is mainly described in the examples below, both "0" and "1" can be written by switching the voltages applied to the bit lines BL between the voltage H and voltage L unless otherwise specified.

As described above, typically, when the predetermined voltage (voltage H) is applied to the two word lines, WL2 and WL3, corresponding to the memory cell MC including the target memory element to be accessed, 123, the two select transistors, CT1 and CT2, of the memory cell are brought into conduction. In this state, a first voltage and a second voltage are applied to the two bit lines, BL1 and BL2, respectively, corresponding to the memory cell. At this time, if the voltage H and voltage L are applied to the bit line BL1 and bit line BL2, respectively, "0" is written; if the voltage L and voltage H are applied to the bit line BL1 and bit line BL2, respectively, "1" is written.

As seen above, information can be written to the particular memory element 10 by using the two bit lines BL and the two word lines WL.

However, if the bit lines (e.g., BL0, BL3, and the like) other than the driven bit lines are kept floating by simply using the typical method above, the following phenomenon occurs.

For example, by applying the voltage H to the word lines WL2 and WL3, all the select transistors CT1 and CT2 coupled to the word lines WL2 and WL3 are turned on. That is, the select transistors CT in the same row in the different columns CL are turned on as well.

Thus, through the memory elements 10 and the select transistors CT1 and CT2, the bit lines BL1 and BL0 are electrically coupled together, and the bit lines BL2 and BL3 are electrically coupled together.

Further, there are multiple bit lines (not shown) on each of the left side of the bit line BL0 and the right side of the bit line BL3. The groups of bit lines are electrically coupled to the bit lines BL1 and B12, respectively.

This increases the line capacitance, reducing the access speed.

SECOND EXAMPLE

Figure 7:
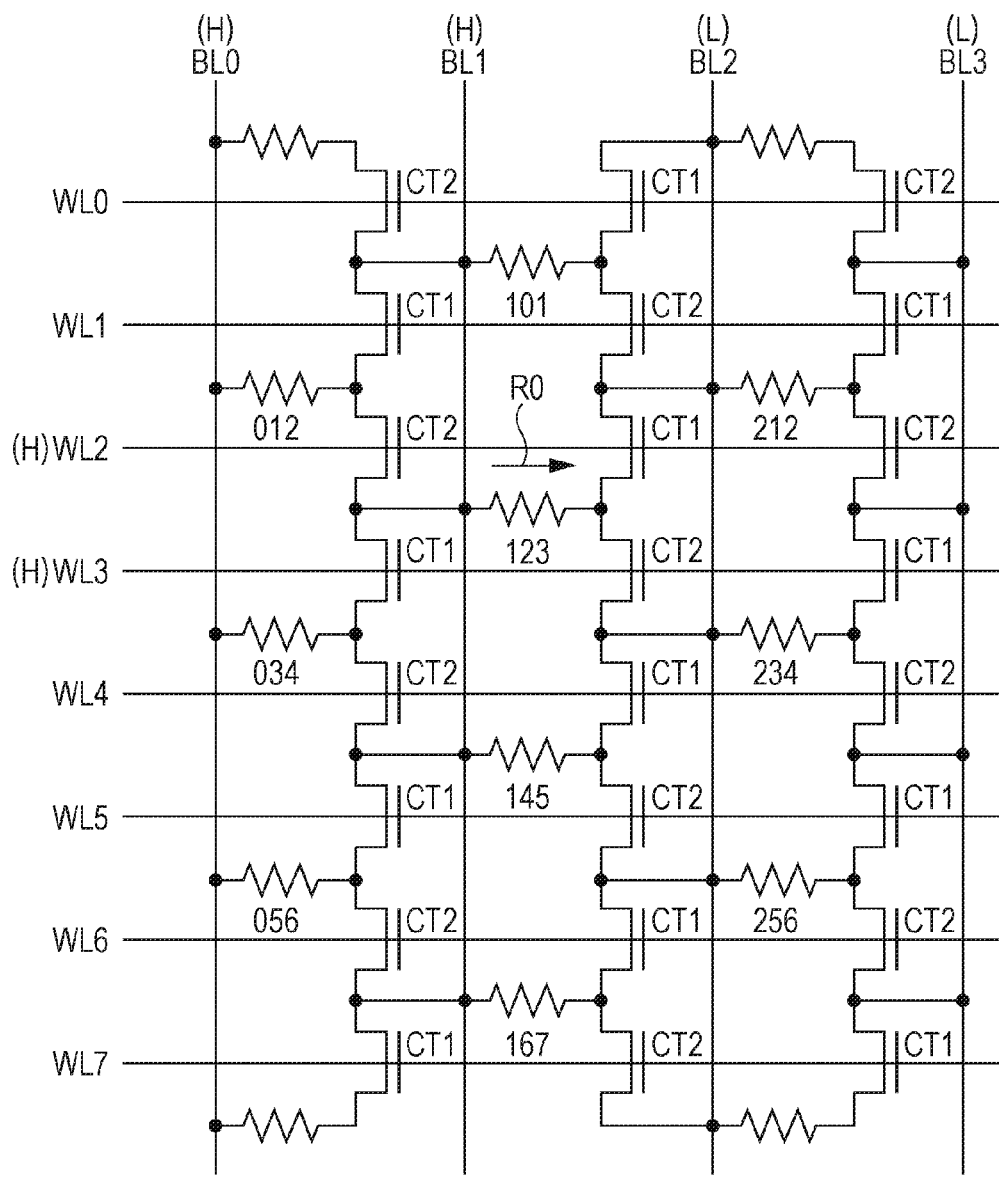
FIG. 7 is a diagram showing a second write method according to the embodiment.

In view of the foregoing, an access method according to a second example shown in FIG. 7 is more preferable.

As in the first example, assume that "0" will be written to a memory element 123.

A low-resistance state, that is, "0" is written to the memory element 123 as follows: a voltage H is applied to bit lines WL2 and WL3; then a voltage H is applied to a bit line BL1 and all bit lines BL on the left of the bit line BL1; and then a voltage L is applied to a bit line BL2 and all bit lines BL on the right of the bit line BL2.

Thus, the current passes through the memory element 123 in the direction of an arrow R0 shown in FIG. 7, reducing the resistance thereof, so that "0" is written thereto.

At this time, all select transistors coupled to word lines WL2 and WL3 are turned on. Accordingly, through the MTJs and select transistors, the bit line BL1 and the bit lines BL on the left of the bit line BL1 are electrically coupled together, and the bit line BL2 and the bit lines BL on the right of the bit line BL2 are electrically coupled together. Nevertheless, the line capacitance is not increased and therefore the access speed does not decrease, since each group of word lines are at the same potential.

In the second example, the voltage L or voltage H is applied to the multiple bit lines BL. For this reason, to select another memory element 10, the voltages of many bit lines BL have to be changed from the voltage L to the voltage H or from the voltage H to the voltage L. Consequently, these bit lines BL are charged or discharged, so that more power is consumed.

THIRD EXAMPLE

Assuming that the operation of the second example is basically performed, there will be described a method for preventing an increase in power consumption according to a third example.

Figure 8A:
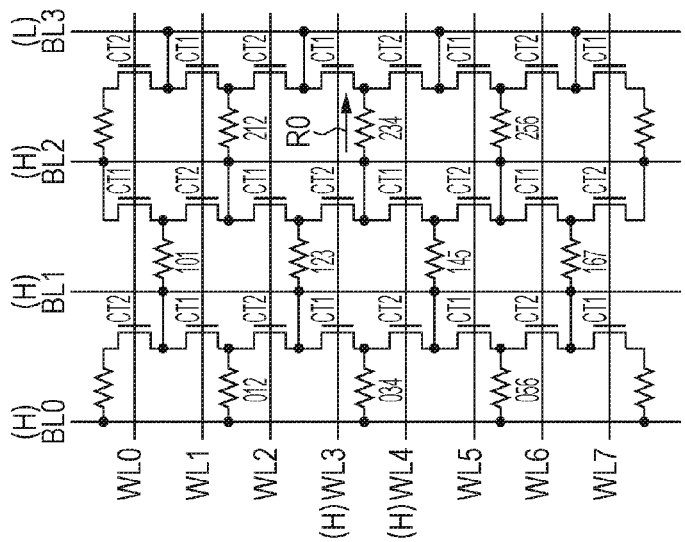
FIGS. 8A to 8C are diagrams showing a third write method according to the embodiment.
Figure 8B:
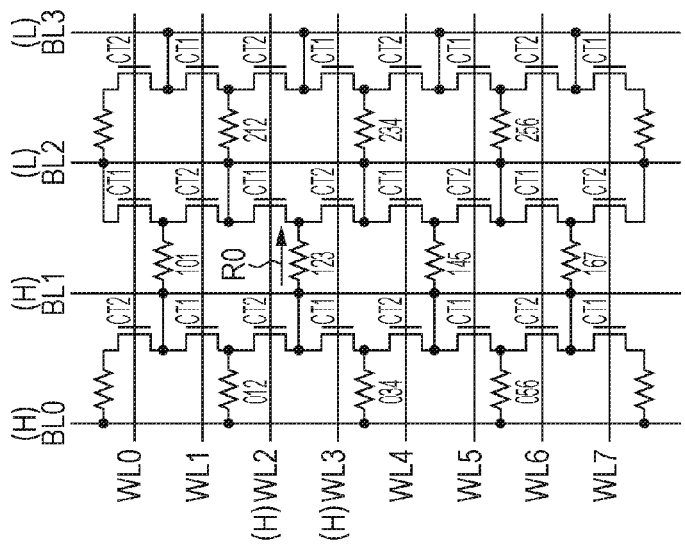
Figure 8C:
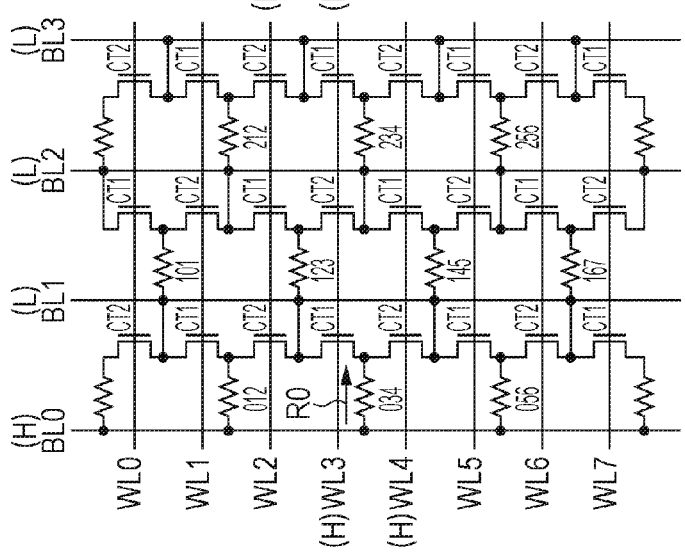

In the third example, the frequency with which the bit lines BL are charged or discharged due to changes in the voltages applied thereto is reduced by sequentially performing the write operation of the second example as shown in FIGS. 8A to 8C.

In FIG. 8A, to write "0" to a memory element 034, a voltage H is applied to a bit line BL0; a voltage L to the bit lines BL other than the bit line BL0; and a voltage H to word lines WL3 and WL4. Thus, the current passes through the memory element 034 in the direction of an arrow R0, reducing the resistance thereof, so that "0" is written thereto.

As shown in FIG. 8B, after writing to the memory element 034, the voltage applied to a bit line BL1 is changed from the voltage L to the voltage H, and the voltage H is applied to the word lines WL2 and WL3. Thus, the current passes through a memory element 123 adjacent to the memory element 034 in the direction of an arrow R0, thereby writing "0" thereto.

In this case, the voltage is changed only with respect to the bit line BL1 of the bit lines BL. Thus, charging or discharging of the bit lines BL can be minimized.

Subsequently, as shown in FIG. 8C, the voltage applied to the bit line BL2 is changed from the voltage L to the voltage H, and the voltage H is applied to the word lines WL3 and WL4. Thus, the current passes through a memory cell 234 adjacent to the memory element 123 in the direction of an arrow R0, thereby writing "0" thereto.

By writing "0" to adjacent multiple memory elements in the above sequence, changes in the voltages of the bit lines BL can be minimized.

While FIGS. 8A to 8C show the operation in which "0" is written to the memory elements 034, 123, 234, and the like, there are also some cases where different pieces of information, such as "0", "1", "0", and the like, are written to adjacent memory elements 10.

For example, if writing of "1", instead of "0", to the memory element 123 is desired, the step of FIG. 8B may be skipped. At the time when the "0" write sequence is complete, the voltage H is being applied to all the bit lines BL.

Accordingly, by applying the voltage L to the bit lines BL, starting with the bit line BL0, "1" can be written to multiple memory elements.

FIG. 9 shows the voltage states of word lines WL and bit lines BL when "0" is written to the target memory elements 034, 123, 234, 323, . . . and (m−1)23 and those when "1" is written thereto. States A1 to An−1 represent the voltage states when "0" is written to the memory cells 034 to (m−1)23. States B1 to Bn−1 represent the voltage states when "1" is written to the memory cells 034 to (m−1)23.

For example, assume that "1" will be written to the memory elements 234 and 323 of the memory elements 034, 123, 234, 323, . . . and (m−1)23 and that "0" will be written to the other memory elements.

In this case, "0" is written to the memory elements other than the memory cells 234 and 323 by performing states A1, A4, A5, . . . and Am−1 in this order as a write sequence. After completing application of the voltage H to all the bit lines BL by applying the voltage H to the last bit line, BLm−1, "1" is written to the memory elements 234 and 323 by performing states B2 and B3 in this order as write operations.

In this way, "0" and "1" can be written in a sequence in which the potentials of the bit lines BL are inverted with a minimum frequency. Note that this method is only illustrative.

FOURTH EXAMPLE

Figure 10A:
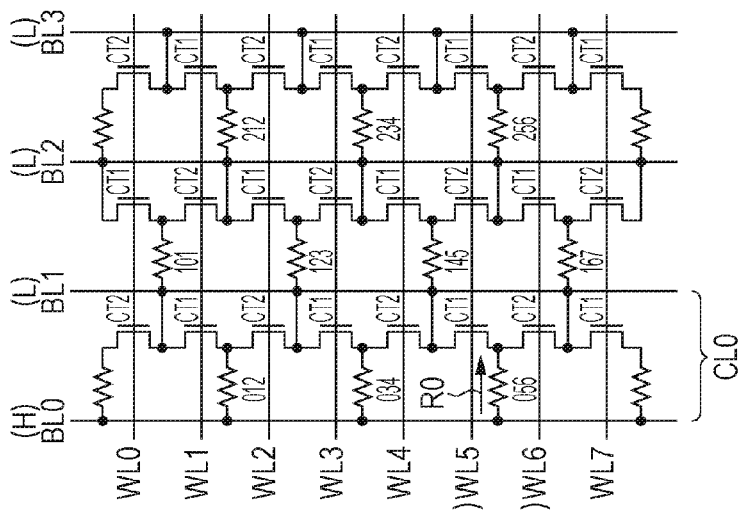
FIGS. 10A to 10C are diagrams showing a fourth write method according to the embodiment.
Figure 10B:
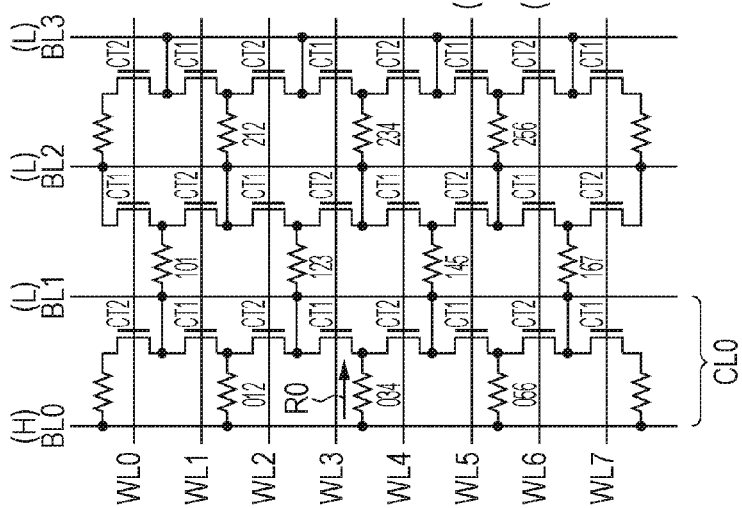
Figure 10C:
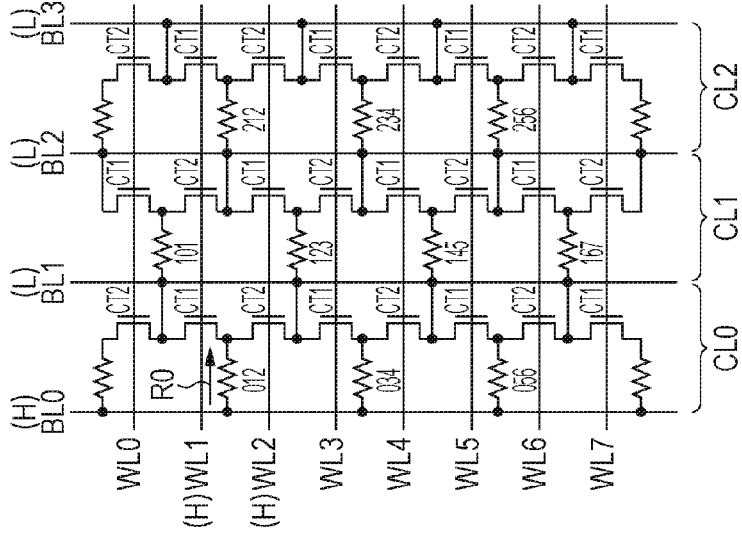

FIGS. 10A to 10C show a fourth example. The fourth example can be said to be an example in which a write sequence as described in the third example is applied in a first direction. That is, the fourth example is an example in which information is sequentially written to the memory cells MC in the same column CL.

The fourth example will be described using a case in which multiple memory cells MC in the column CL0 are accessed.

In FIG. 10A, a voltage H is applied to a bit line BL0, and a voltage L to the bit lines other than the bit line BL0. In this case, "0" is written to a memory element 012 by applying a voltage H to word lines WL1 and WL2.

Then, as shown in FIG. 10B, "0" is written to a memory element 034 by leaving the voltages of the bit lines BL alone and applying the voltage H to word lines WL3 and WL4.

Then, as shown in FIG. 10C, "0" is written to a memory element 056 by leaving the voltages of the bit lines BL alone and applying the voltage H to word lines WL5 and WL6.

As seen above, after a certain memory cell is accessed, other memory cells in the same column CL are accessed by leaving the voltages applied to the bit lines BL alone and changing two word lines WL to which the select voltage H is to be applied.

That is, by accessing as many memory cells MC in the same column as possible, the frequency with which the potentials of the bit lines BL are inverted is minimized. This is useful to reduce power consumption.

FIFTH EXAMPLE

A fifth example is a write operation in which the third and fourth examples are combined. This example will be described with reference to timing charts of FIGS. 11 and 12. The vertical axis of each timing chart represents the potentials of bit lines BL0 to BL3 and those of word lines WL0 to WL7, and the horizontal axis thereof represents the time in the form of memory elements to be accessed, 012, 034, and the like.

For the sake of simplification, it is assumed that each column CL includes three or four memory elements 10. For example, memory elements 012, 034, and 056 are memory elements 10 in a column CL0. Memory elements 101, 123, 145, and 167 are memory elements 10 in a column CL1.

Figure 11:
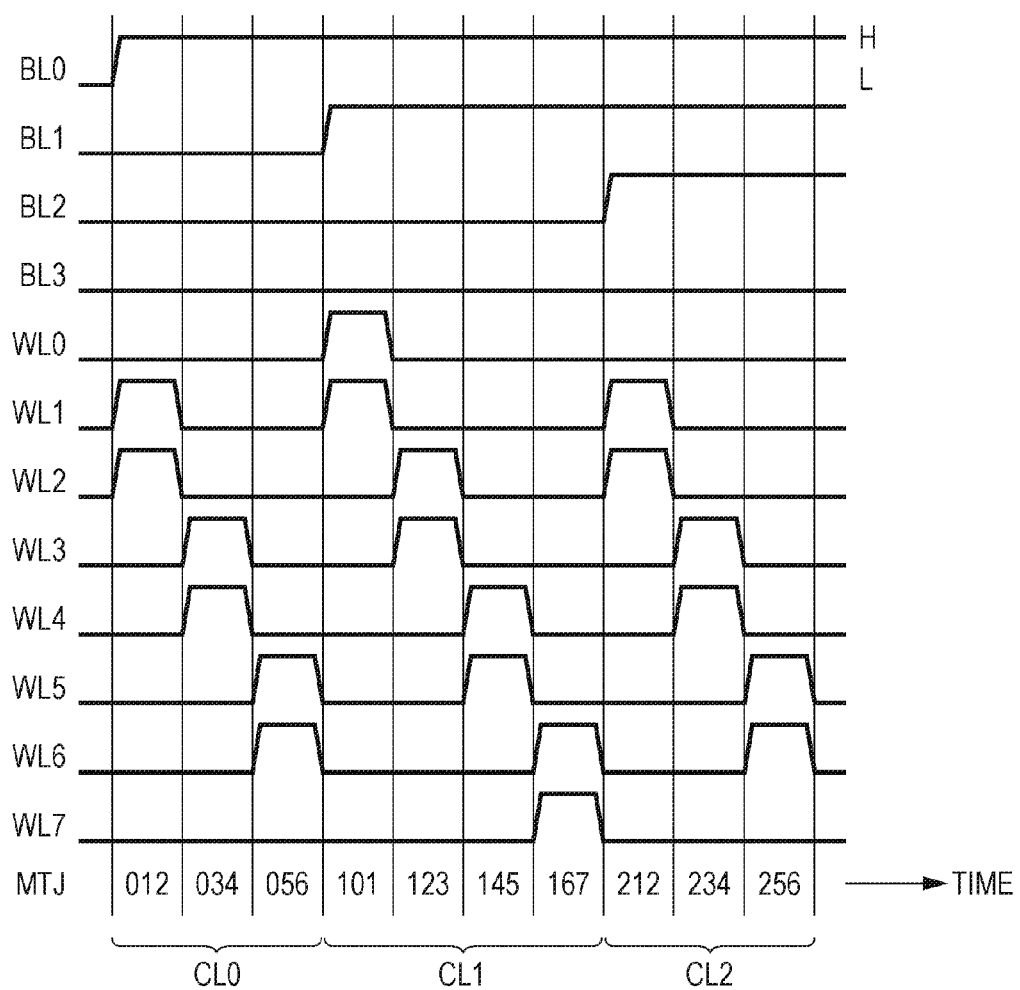
FIG. 11 is a waveform chart showing a fifth write method according to the embodiment.

As shown in FIG. 11, first, a voltage H is applied to the bit line BL0; a voltage L to the bit lines BL1 to BL3; and a voltage H to the word lines WL1 and WL2. Thus, "0" is written to the memory element 012.

Subsequently, as in the fourth example, "0" is written to the memory element 034 and then the memory element 056. Specifically, "0" is written to the memory element 034 by applying the voltage H to the word lines WL3 and WL4 without changing the voltages of the bit lines BL and then written to the memory cell 056 by applying the voltage H to the word lines WL5 and WL6 without changing the voltages of the bit lines BL.

After writing to the memory elements in the column CL0 between the bit lines BL0 and BL1 as described above, the voltage applied to the bit line BL1 is changed from the voltage L to the voltage H, as in the third example. In this state, as in the fourth example, information is sequentially written to the memory elements (101, 123, 145, 167) in the column CL1 between the bit lines BL1 and BL2.

Specifically, "0" is written to the memory element 101 by applying the voltage H to the word lines WL0 and WL1, then written to the memory element 123 by applying the voltage H to the word lines WL2 and WL3 without changing the voltages of the bit lines BL, then written to the memory element 145 by applying the voltage H to the word lines WL4 and WL5 without changing the voltages of the bit lines BL, and then written to the memory cell 167 by applying the voltage H to the word lines WL6 and WL7 without changing the voltages of the bit lines BL.

In this way, "0" is written to the memory elements 10 in the column CL1.

Similarly, "0" is written to the memory elements (212, 234, 256) in the column CL2 between the bit lines BL2 and BL3.

By repeating the above sequence, "0" is written to all memory elements.

After the "0" write sequence is complete, "1" can be written to multiple memory elements 10 by applying the voltage L to the bit lines BL, to which the voltage H is being applied, starting from the bit line BL0.

Figure 12:
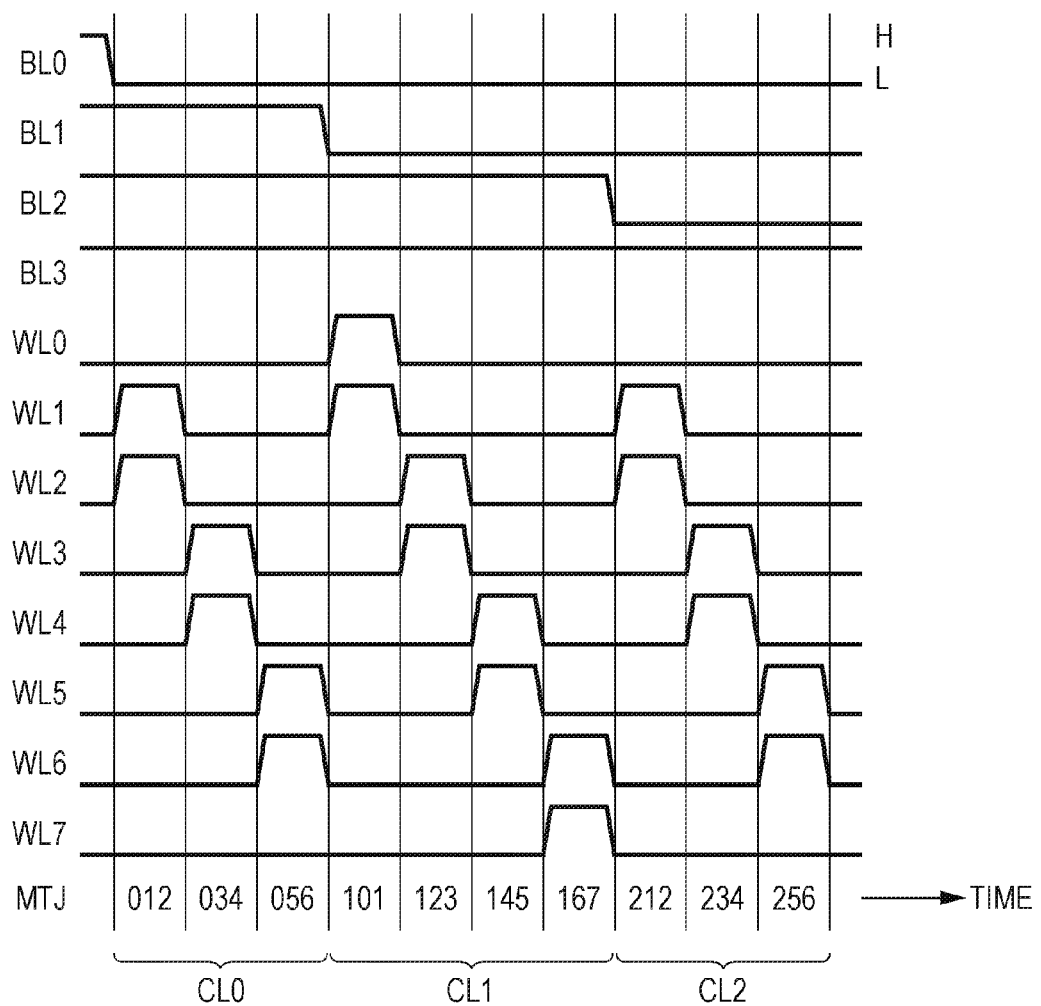
FIG. 12 is a waveform chart showing the fifth write method according to the embodiment.

As shown in FIG. 12, first, the voltage L is applied to the bit line BL0. For the bit lines BL1 to BL3, the voltage H is still being applied thereto.

Then, the voltage H is applied to the word lines WL1 and WL2. Thus, "1" is written to the memory element 012.

Subsequently, "1" is written to the memory element 034 and then the memory element 056 in the column CL0. Specifically, "1" is written to the memory element 034 by applying the voltage H to the word lines WL3 and WL4 without changing the voltages of the bit lines BL and then written to the memory cell 056 by applying the voltage H to the word lines WL5 and WL6 without changing the voltages of the bit lines BL.

After writing to the memory elements in the column CL0 between the bit lines BL0 and BL1 as described above, the voltage applied to the bit line BL1 is changed from the voltage H to the voltage L. Then, "1" is sequentially written to the memory elements (101, 123, 145, 167) in the column CL1 between the bit lines BL1 and BL2.

In this way, "1" can be written sequentially.

Actually, in the "1" write sequence of FIG. 12, it is only necessary to write "1" to the memory elements 10 skipped in the "0" write sequence of FIG. 11.

Thus, information is efficiently written so that the frequency with which the potentials of the bit lines are inverted is minimized. That is, information is written in such a manner that power consumption is reduced and the write speed is not reduced.

4. SUMMARY AND MODIFICATION

As described above, the memory device 1 of the present embodiment includes the multiple bit lines BL extending in the first direction, the multiple word lines WL extending in the second direction, and the multiple memory cells MC each coupled to corresponding two word lines WL and two bit lines BL.

Each memory cell MC includes the memory element 10 configured to store information on the basis of changes in resistance and the two select transistors, CT1 and CT2. One terminal of the memory element 10 is coupled to one of the two bit lines BL corresponding to the memory cell, and the other terminal is coupled to the drains of the two select transistors, CT1 and CT2. The sources of the select transistors CT1 and CT2 are coupled to the other of the two bit lines BL corresponding to the memory cell MC. The gate of one of the two select transistors, CT1 and CT2, is coupled to one of the two word lines WL corresponding to the memory cell MC, and the gate of the other select transistor is coupled to the other of the two word lines WL corresponding to the memory cell MC.

One column CL is formed by repeatedly arranging memory cells MC in the first direction, and the memory cell array 2 is formed by repeatedly arranging columns CL in the second direction.

In this configuration, the current for access passes through one memory element 10 via two select transistors, CT1 and CT2, and the effective gate width is doubled. Thus, it is possible to increase the current drive capability and thus to stably make write access.

In each column CL, the adjacent select transistors of every two memory cells MC adjacent in the first direction share the diffusion region therebetween as the source. Thus, the memory cells can be laid out efficiently.

In the memory cell array 2, every two columns adjacent in the second direction share one bit line BL, and the even-numbered columns and the odd-numbered columns are displaced from each other by the distance between adjacent word lines. Thus, it is possible to arrange select transistors CT1 and CT2 more efficiently and to reduce the number of necessary bit lines. As a result, memory cells can be efficiently laid out.

As described in the first to fifth examples, in order to make a write or read access to a memory cell MC, the two select transistors of the memory cell MC are brought into conduction by applying a predetermined select voltage to two word lines WL corresponding to the memory cell MC, and the first and second voltages are applied to two bit lines BL corresponding to the memory cell MC. That is, by turning on the select transistors CT1 and CT2 using the two word lines WL, the memory cell MC is selected. Then the current for writing information "0" or "1" on the basis of the potential relationship between the two bit lines BL passes through the memory element 10. In this way, information is properly written to the memory cells MC.

As described in the second to fifth examples, preferably, the second voltage is applied to all bit lines closer to the second bit line of the two bit lines BL corresponding to the target memory cell MC to be accessed than to the first bit line thereof, and the first voltage is applied to all bit lines closer to the first bit line than to the second bit line.

Thus, it is possible to prevent access to the memory cell MC from being affected by the line capacitance and thus to prevent a reduction in access speed.

As described in the third to fifth examples, after the target memory cell MC is accessed, a memory cell in an adjacent column CL is accessed by changing the voltage applied to one of the first and second bit lines.

Thus, when memory cells MC are sequentially accessed, it is possible to minimize variations in the voltages of the bit lines BL to reduce the frequency with which the bit lined BL are charged or discharged. As a result, further power savings are possible.

Also, as described in the fourth and fifth examples, if others memory cells in the same column are sequentially accessed by changing two word lines to which the select voltage is to be applied, without changing the voltages applied to the first and second bit lines, variations in the voltages of the bit lines BL can be avoided. This is also useful for power savings.

For the reasons above, the present embodiment can provide a resistive memory device capable of increasing the current applicable to the memory element 10 and preventing increases in cell size.

While MTJs in MRAM are used as the memory elements 10 of a resistive memory device in the embodiment, the present technology is not limited to MRAM and is also applicable to other types of resistive memory, including resistive random access memory (ReRAM) and phase-change random access memory (PCRAM).

Note that the effects described in the present specification are only illustrative and other effects may be obtained.

The present technology may be configured as follows:

(1) A memory device including: a plurality of bit lines extending in a first direction; a plurality of word lines extending in a second direction crossing the first direction; and a plurality of memory cells each coupled to corresponding two of the word lines and corresponding two of the bit lines, wherein each of the memory cells includes a memory element and two select transistors, the memory element being configured to store information on the basis of changes in resistance, wherein one terminal of the memory element is coupled to one of the two bit lines corresponding to the memory cell, wherein the other terminal of the memory element is coupled to respective drains of the two select transistors, wherein respective sources of the two select transistors are coupled to the other of the two bit lines corresponding to the memory cell, wherein a gate of one of the two select transistors is coupled to one of the two word lines corresponding to the memory cell, wherein a gate of the other of the two select transistors is coupled to the other of the two word lines corresponding to the memory cell, and wherein one column is formed by repeatedly arranging the memory cell in the first direction, and wherein a memory cell array is formed by repeatedly arranging the column in the second direction.

(2) The memory device according to the above (1), wherein adjacent select transistors of two memory cells adjacent in the first direction in the column share a source.

(3) The memory device according to the above (1) or (2), wherein two columns adjacent in the second direction in the memory cell array share one of the bit lines, and wherein even-numbered columns and odd-numbered columns are displaced from each other by a distance between adjacent word lines.

(4) The memory device according to any one of the above (1) to (3), wherein of the memory cells, a target memory cell to be accessed is accessed by applying a predetermined select voltage to two word lines corresponding to the target memory cell to bring the select transistors of the target memory cell into conduction and applying first and second voltages to two bit lines corresponding to the target memory cell.

(5) A method for accessing a memory device, the memory device including a plurality of bit lines extending in a first direction, a plurality of word lines extending in a second direction crossing the first direction, and a plurality of memory cells each coupled to corresponding two of the word lines and corresponding two of the bit lines, each of the memory cells including a memory element and two select transistors, the memory element being configured to store information on the basis of changes in resistance, one terminal of the memory element being coupled to one of the two bit lines corresponding to the memory cell, the other terminal of the memory element being coupled to respective drains of the two select transistors, respective sources of the two select transistors being coupled to the other of the two bit lines corresponding to the memory cell, a gate of one of the two select transistors being coupled to one of the two word lines corresponding to the memory cell, a gate of the other of the two select transistors being coupled to the other of the two word lines corresponding to the memory cell, one column being formed by repeatedly arranging the memory cell in the first direction, a memory cell array being formed by repeatedly arranging the column in the second direction, the method including: bringing the two select transistors of a target memory cell to be accessed into conduction by applying a predetermined select voltage to two word lines corresponding to the target memory cell; and applying a first voltage to a first bit line of two bit lines corresponding to the target memory cell and applying a second voltage to a second bit line of the two bit lines.

(6) The method according to the above (5), wherein two columns adjacent in the second direction in the memory cell array of the memory device share one of the bit lines, wherein even-numbered columns and odd-numbered columns are displaced from each other by a distance between adjacent word lines, the method further including: applying the second voltage to all bit lines closer to the second bit line than to the first bit line; and applying the first voltage to all bit lines closer to the first bit line than to the second bit line.

(7) The method according to the above (6), wherein after the target memory cell is accessed, a memory cell in an adjacent column is accessed by changing the voltage applied to one of the first and second bit lines.

(8) The method according to the above (6) or (7), wherein after the target memory cell is accessed, another memory cell in the same column is accessed by changing two word lines to which the select voltage is to be applied, without changing the voltages applied to the first and second bit lines.

It should be understood by those skilled in the art that various modifications, combinations, sub-combinations and alterations may occur depending on design requirements and other factors insofar as they are within the scope of the appended claims or the equivalents thereof.

What is claimed is:

1. A memory device comprising:
    a plurality of bit lines extending in a first direction;
    a plurality of word lines extending in a second direction crossing the first direction; and
    a plurality of memory cells, each memory cell of the plurality of memory cells includes a memory element directly coupled to a first terminal of the memory cell and two select transistors having a first select transistor and a second select transistor disposed along the first direction, the memory element being configured to store information based on changes in resistance,
    wherein a first column and a second column adjacent to the first column are formed by repeatedly arranging a first group of the plurality of memory cells and a second group of the plurality of memory cells, respectively, along the first direction,
    wherein the first group of the plurality of memory cells is displaced with respect to the second group of the plurality of memory cells in the first direction such that, in the second direction, the first select transistor in respective memory cells of the first group of the plurality of memory cells in the first column is aligned with the second select transistor in respective memory cells of the second group of the plurality of memory cells in the second column,
    wherein the first column and the second column share one of the plurality of bit lines,
    wherein the first terminal of at least one memory cell of the first group is directly coupled to a first bit line of the plurality of bit lines that is different than the one of the plurality of bit lines that is shared, and
    wherein the first terminal of at least one memory cell of the second group is directly coupled to the one of the plurality of bit lines that is shared.

2. The memory device according to claim 1, wherein adjacent select transistors of two memory cells of the plurality of memory cells adjacent in the first direction share a source.

3. The memory device according to claim 1, wherein of the plurality of memory cells, a target memory cell to be accessed is accessed by applying a predetermined select voltage to two word lines corresponding to the target memory cell to bring the two select transistors of the target memory cell into conduction and applying first and second voltages to two bit lines corresponding to the target memory cell.

4. The memory device according to claim 1, wherein the each memory cell of the plurality of memory cells is coupled to corresponding two word lines of the plurality of word lines and corresponding two bit lines of the plurality of bit lines.

5. The memory device according to claim 4, wherein a second terminal of the memory element is coupled to respective drains of the two select transistors.

6. The memory device according to claim 4, wherein respective sources of the two select transistors are coupled to the other one of the two bit lines corresponding to the memory cell.

7. The memory device according to claim 4, wherein a gate of a first one of the two select transistors is coupled to a first one of the two word lines corresponding to the memory cell.

8. The memory device according to claim 7, wherein a gate of a second one of the two select transistors is coupled to a second one of the two word lines corresponding to the memory cell.

9. A method for accessing a memory device, the memory device including a plurality of bit lines extending in a first direction, a plurality of word lines extending in a second direction crossing the first direction, and a plurality of memory cells, each memory cell of the plurality of memory cells includes a memory element directly coupled to a first terminal of the memory cell and two select transistors having a first select transistor and a second select transistor disposed along the first direction, the memory element being configured to store information based on changes in resistance, a first column and a second column adjacent to the first column are formed by repeatedly arranging a first group of the plurality of memory cells and a second group of the plurality of memory cells, respectively, along the first direction, wherein the first group of the plurality of memory cells is displaced with respect to the second group of the plurality of memory cells in the first direction such that, in the second direction, the first select transistor in respective memory cells of the first group of the plurality of memory cells in the first column is aligned with the second select transistor in respective memory cells of the second group of the plurality of memory cells in the second column, wherein the first column and the second column share one of the plurality of bit lines, wherein the first terminal of at least one memory cell of the first group is directly coupled to a different one of the plurality of bit lines that is different than the one of the plurality of bit lines that is shared, and wherein the first terminal of at least one memory cell of the second group is directly coupled to the one of the plurality of bit lines that is shared, the method comprising:

bringing the two select transistors of a target memory cell to be accessed into conduction by applying a predetermined select voltage to two word lines that correspond to the target memory cell;

applying a first voltage to a first bit line of two bit lines of the plurality of bit lines that correspond to the target memory cell; and applying a second voltage to a second bit line of the two bit lines of the plurality of bit lines that correspond to the target memory cell.

10. The method according to claim 9, further comprising applying the second voltage to all bit lines closer to the second bit line than to the first bit line; and
applying the first voltage to all bit lines closer to the first bit line than to the second bit line.

11. The method according to claim 9, wherein after the target memory cell is accessed, a memory cell in an adjacent column is accessed by changing a voltage applied to one of the first bit line and the second bit line.

12. The method according to claim 9, wherein after the target memory cell is accessed, another memory cell in the same column is accessed by changing to another two word lines of the plurality of word lines to which the predetermined select voltage is to be applied, without changing voltages applied to the first bit line and the second bit line.

13. The method according to claim 9, wherein the each memory cell of the plurality of memory cells is coupled to corresponding two word lines of the plurality of word lines and corresponding two bit lines of the plurality of bit lines.

14. The method according to claim 13, wherein a second terminal of the memory element is coupled to respective drains of the two select transistors.

15. The method according to claim 14, wherein respective sources of the two select transistors is coupled to the other one of the two bit lines corresponding to the memory cell.

16. The method according to claim 13, wherein a gate of a first one of the two select transistors is coupled to a first one of the two word lines corresponding to the memory cell, and wherein a gate of a second one of the two select transistors is coupled to a second one of the two word lines corresponding to the memory cell.

* * * * *